United States Patent
Lozhkin (10) Patent No.: US 8,559,551 B2
(45) Date of Patent: Oct. 15, 2013

(54) FILTER DEVICE STOPPING INPUT OF ZERO-VALUED SAMPLE

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 337 days.

(21) Appl. No.: 12/864,642

(22) PCT Filed: Feb. 21, 2008

(86) PCT No.: PCT/JP2008/053452
§ 371 (c)(1),
(2), (4) Date: Jul. 26, 2010

(87) PCT Pub. No.: WO2009/104278
PCT Pub. Date: Aug. 27, 2009

(65) Prior Publication Data
US 2010/0310007 A1    Dec. 9, 2010

(51) Int. Cl.
*H04K 1/02* (2006.01)
(52) U.S. Cl.
USPC ............ 375/296; 375/295; 375/350; 455/308
(58) Field of Classification Search
None
See application file for complete search history.

(56) References Cited

U.S. PATENT DOCUMENTS

| | | | |
|---|---|---|---|
| 5,619,438 A * | 4/1997 | Farley et al. | 708/313 |
| 2002/0062328 A1 | 5/2002 | Akahori | |
| 2005/0163201 A1* | 7/2005 | Krasner | 375/150 |
| 2006/0089957 A1* | 4/2006 | Kim et al. | 708/232 |

FOREIGN PATENT DOCUMENTS

| | | |
|---|---|---|
| JP | 04044410 | 2/1992 |
| JP | 06181424 | 6/1994 |
| JP | 2002158561 | 5/2002 |

OTHER PUBLICATIONS

J.G. Proakis and D.G. Manolakis, "Digital Signal Processing; Principles, Algorithms, and Applications", Prentice Hall, p. 503, 1996.
J. Armstrong, "New OFDM Peak-to-Average Power Reduction Scheme", Proceedings of VTC, vol. 1, pp. 756-760, May 2001.
H.A. Suraweera, et al., "OFDM Peak-to-Average Power Reduction Scheme with Spectral Masking" Proceedings of International Symposium on Communication Systems Networks and Digital Signal Processing (CSNDSP 2004), pp. 160-163, Jul. 2004.
L.D. Kabulepa, et al., "Design Space Exploration for Clipping and Filtering PAPR Reduction Techniques in OFDM Systems", Proceedings of the 8th International OFDM Workshop, pp. 108-112, 2003.
International Search Report dated Jun. 3, 2008 in corresponding International application No. PCT/JP2008/053452.

* cited by examiner

*Primary Examiner* — Leon-Viet Nguyen
(74) *Attorney, Agent, or Firm* — Smith, Gambrell & Russell, LLP (57) ABSTRACT

An input signal to a filter device is allowed to be written into one of a plurality of sequentially connected cells if the input signal is not the zero-valued sample. Each cell receives the input signal and multiplies the input signal by one of a plurality of weight coefficients. The input signal is stopped to be written into any of the cells if the input signal is the zero-valued sample. A result of a filtering operation is output from the last cell.

10 Claims, 9 Drawing Sheets

RELATED ART

F I G. 1

RELATED ART

| CR Level [dB] | Number of Zero Samples in Clip(t) [%] | Number of Non-zero Samples in Clip(t) [%] |
|---|---|---|
| 3 | 84 | 16 |
| 4 | 90 | 10 |
| 5 | 95 | 5 |
| 6 | 97.2 | 2.8 |

FILTER DEVICE STOPPING INPUT OF ZERO-VALUED SAMPLE

TECHNICAL FIELD

The present invention relates to a filter device for performing multiplication operations of an input signal and coefficients and a summation operation of the obtained multiplication results.

BACKGROUND ART

Figure 1:
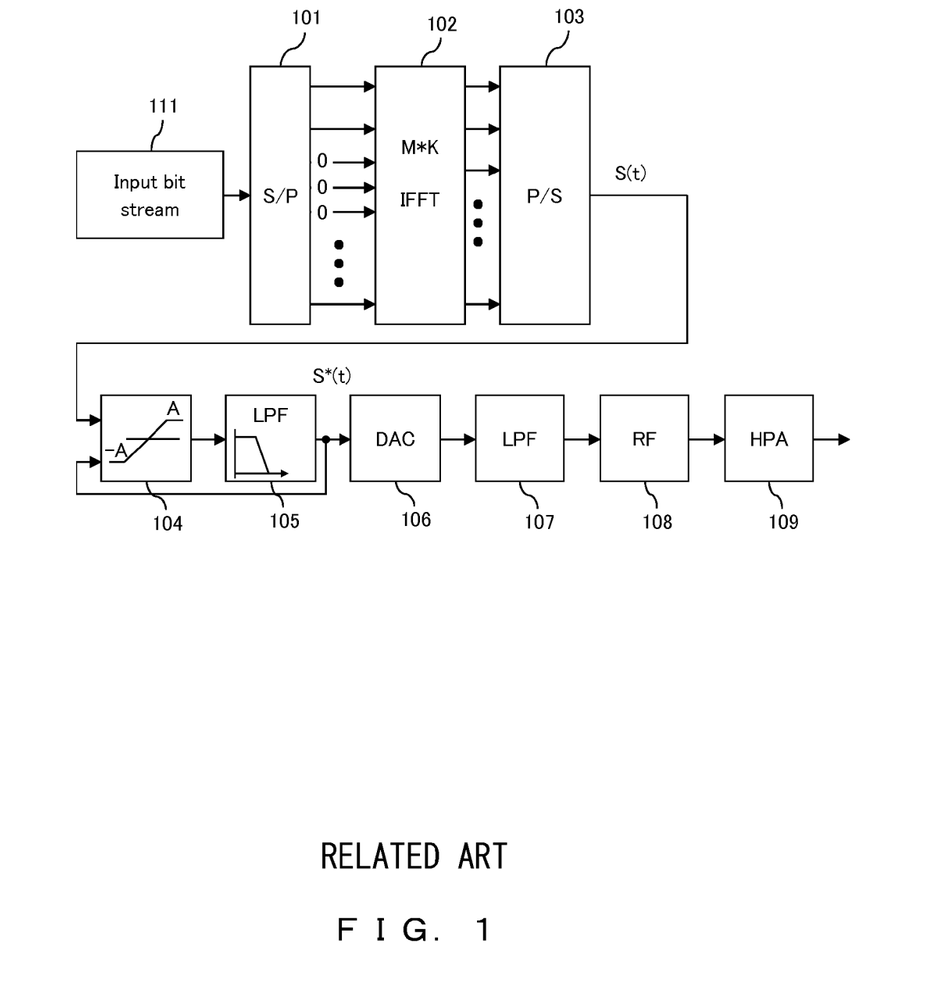
FIG. 1 is a configuration diagram showing a conventional transmitter in an OFDM communication system.

FIG. 1 shows a configuration example of a conventional transmitter in an orthogonal frequency division multiplexing (OFDM) communication system. This transmitter comprises a serial-to-parallel (S/P) converter 101, an inverse fast Fourier transform (IFFT) processor 102 with a size of M, a parallel-to-serial (P/S) converter 103, a limiter 104, low pass filters (LPFs) 105 and 107, a digital-to-analog converter (DAC) 106, a radio frequency (RF) up-converter 108 and a high-power amplifier (HPA) 109 operating in class A or A-B.

The S/P converter 101 converts the input bit stream 111 representing data to be transmitted into parallel signals. The IFFT processor 102 operates as an interpolator and performs M×K IFFT over the parallel signals with an oversampling factor of K. The P/S converter 103 converts output signals from the IFFT processor 102 into a signal S(t).

The amplitude of the signal S(t) is clipped at the level A by the limiter 104. Such clipping is implemented for reducing peak-to-average power ratio (PAPR) of OFDM signals, i.e. removing the high amplitude peak. In order to avoid growth of the out-of-band radiation, however, an additional LPF 105 is necessary. The output signal from the limiter 104 passes through the LPF 105 for out-of-band power suppression and the filtered signal is output to the DAC 106 and limiter 104.

The DAC 106 converts an output signal S*(t) from the LPF 105 into an analog signal. The output analog signal passes through the LPF 107 and up-converted by the RF up-converter 108. The HPA 109 amplifies the obtained RF signal and outputs it to an antenna (not shown).

The filter task is based upon a finite-impulse response (FIR) with N coefficients and recursive filters. The direct form realization of the FIR is the convolutional summation such as the following equation (see non-patent document 1).

$$y(n) = \sum_{k=0}^{N-1} h(k) \cdot x(n-k) \quad (1)$$

In equation (1), y(n) is an FIR output signal, x(n) is an FIR input signal, h(n) is unit samples of the FIR and N is the length of the FIR (number of the filter taps). In the case of the configuration shown in FIG. 1, it is assumed that S*(t)=y(n).

Figure 2:
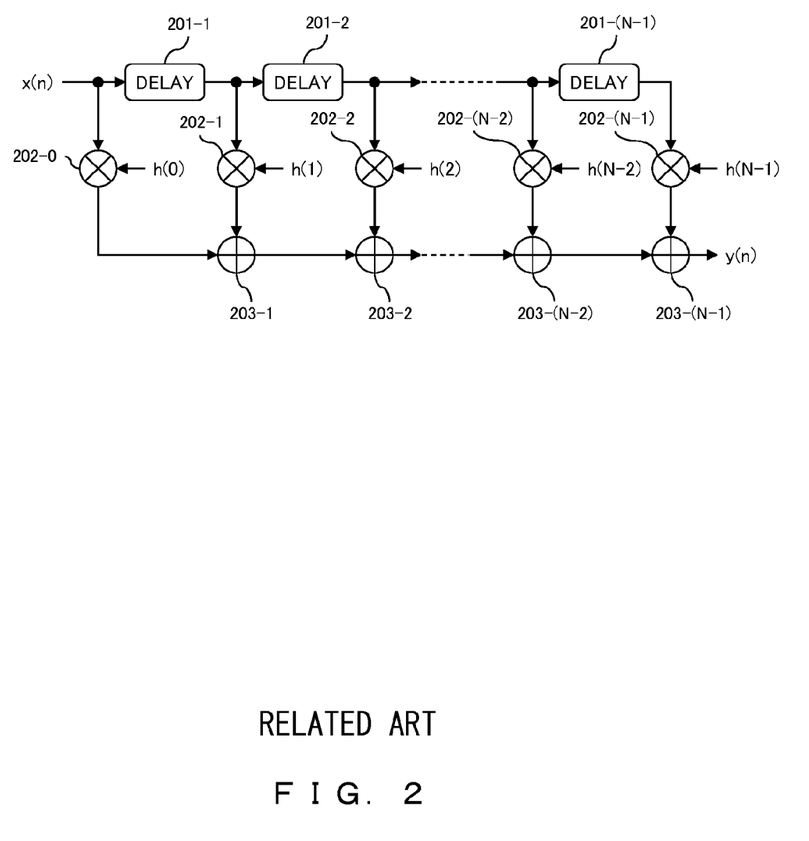
FIG. 2 is a configuration diagram showing a conventional FIR filter.

The structure of an FIR filter based on equation (1) is shown in FIG. 2. The FIR filter comprises delays 201-1 through 202-(N−1), multipliers 202-0 through 202-(N−1) and adders 203-1 through 203-(N−1). As can be seen from FIG. 2, the number of multiplication operations for the FIR with N taps equals N.

For example, in an OFDM communication system with a large number of subcarriers, in order to obtain the strong out-of-band power suppressions (typically −50 through −75 dB), an LPF must have very long pulse response. This causes a very large number of multiplications during filtration and the total number of FIR's weight coefficients must be large.

According to simulation results described later, an FIR with at least 512 taps can provide the necessary out-of-band power suppressions.

In application specific integrated circuit (ASIC) or field programmable gate array (FPGA) implementations, an 8-bit multiplier is about 8 times more complex than an adder. Thus, a reduction of the number of multipliers is the primary target for the complexity reduction in a digital filter device.

Figure 3:
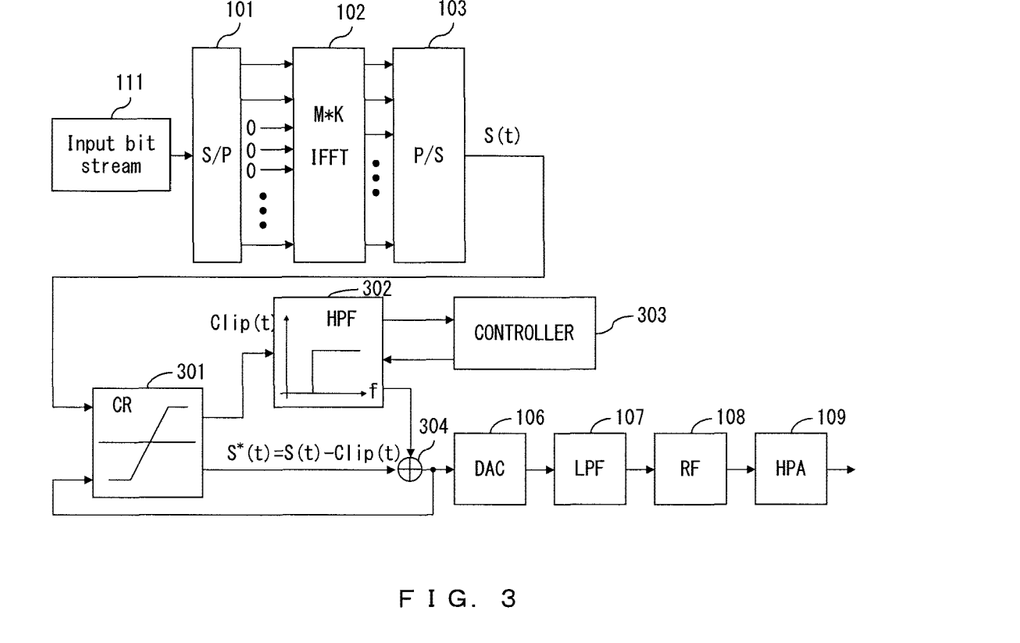
FIG. 3 is a configuration diagram showing a conventional transmitter with an HPF in place of an LPF.

In a prior Japan patent application No. 2006-324736, it was shown that a clipping-and-filtering approach employed the LPF 105 shown in FIG. 1 can be represented as shown in FIG. 3 with replacement of the LPF 105 with a high pass filter (HPF) 302. The operation of a constituent element shown in FIG. 3 with the same numeral as that of a constituent element shown in FIG. 1 is similar to the operation of the element.

A limiter 301 clips the amplitude of the signal S(t) and outputs a clipping signal Clip (t) and a clipped signal S*(t) (=S(t)−Clip (t)). The HPF 302 is configured as shown in FIG. 2 and controlled by a controller 303 to perform a high pass filtering of the clipping signal Clip (t). The controller 303 receives the clipping signal Clip (t) from the HPF 302 and enables the HPF 302 to skip multiplication operations for zero-value samples included in the clipping signal Clip (t). An adder 304 adds the filtered signal and the clipped signal S*(t) and outputs a resulting signal to the DAC 106 and the limiter 301.

An out-of-band component of the clipping signal Clip (t) output from the HPF 302 is in opposite phase to that of the out-of-band component of the clipped signal S*(t). Therefore, adding the output signal and the clipped signal S*(t), the out-of-band component of the clipped signal S*(t) is cancelled out.

As described above, the clipped signal or the clipping signal is filtered in the LPF 105 shown in FIG. 1 or the HPF 302 shown in FIG. 2 to remove the resulting out-of-band power. In Non-patent Documents 2 and 3, the LPF filter unit is composed of a pair of larger FFT and IFFT modules. In Non-patent Document 4, the filter task is based upon an FIR with 103 coefficient and recursive filters.

Figure 4:
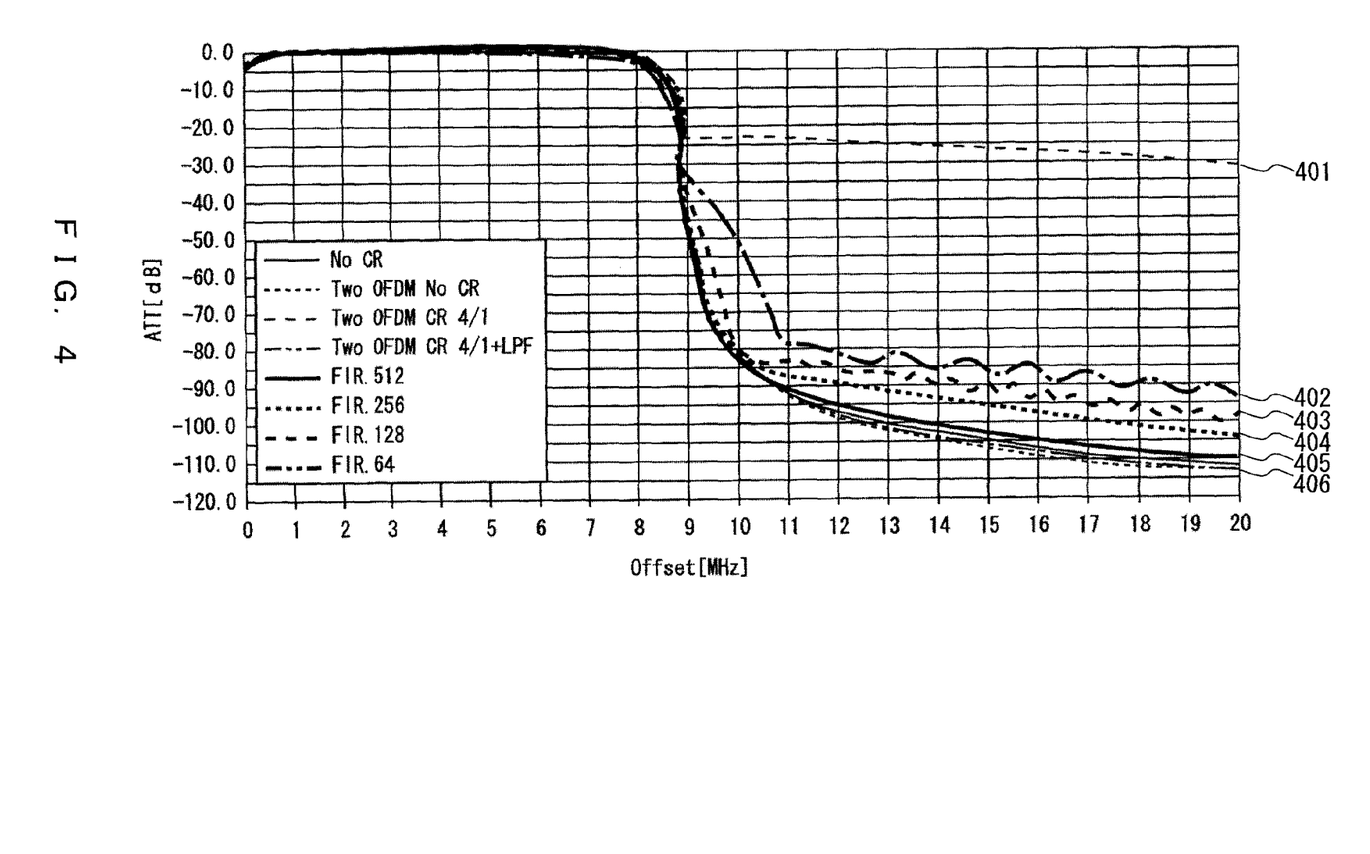
FIG. 4 is a graph showing simulation results of the level of out-of-band power suppression for a WiMAX system.

For example, FIG. 4 shows simulation results of the level of out-of-band power suppression for a world wide interoperability for microwave access (WiMAX) system with 2048 subcarriers. ATT expressed in dB represents the level of out-of-band power suppression, the clipping level or clipping ratio (CR) equals 4 dB and the number of FIR's taps N is used as a parameter. A curved line 401 represents an OFDM signal spectrum after clipped at the level of 4 dB and three curved lines 406 represent a theoretical OFDM signal spectrum, an OFDM signal spectrum without clipping and an OFDM signal spectrum after clipped at the level of 4 dB and filtered by an LPF, where the three overlap each other. Four curved lines 402, 403, 404 and 405 represent signal spectra of FIRs with 64, 128, 256 and 512 taps, respectively.

Plots in FIG. 4 show the substantial improvement in the out-of-band power suppression when the length of FIR (the number of taps N) increases. Thus, according to the simulation results, the FIR with 512 taps provides satisfactory out-of-band power suppressions. Obviously, the FIRs with less than 512 taps provide unsatisfactory out-of-band power suppression. a Larger number of taps requires a larger number of multipliers that are more complex than adders.

Let's consider the special type of the input signal x(t). It is supposed that the input signal x(t) contains several samples with zero amplitude. A good example of such a zero-containing signal is the clipping signal Clip (t). According to the configuration shown in FIG. 3, the clipping signal Clip (t) can be described by the following equations.

$$S(t) = \rho \cdot \exp(j \cdot \varphi) \quad (2)$$

$$S^*(t) = \begin{cases} S(t) & \text{for } \rho < A \\ A \cdot \exp(j \cdot \varphi) & \text{for } \rho > A \end{cases} \quad (3)$$

$$\text{Clip}(t) = S(t) - S^*(t) \quad (4)$$

In equations (2) and (3), S(t) is the original (non-clipped) OFDM signal and S*(t) is the clipped signal. Further, ρ and φ are an amplitude and a phase, respectively, of S(t) and A is the clipping level or CR. Clip (t) in equation (4) represents the difference between the original signal S(t) and the clipped signal S*(t).

Figure 5:
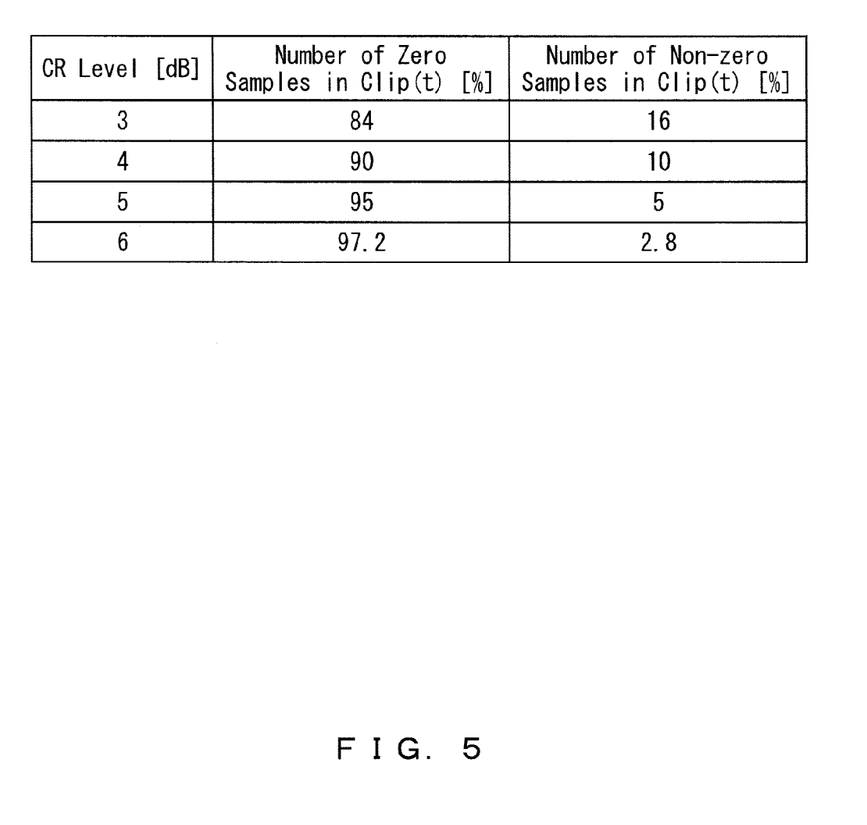
FIG. 5 is a table showing numbers of zero and non-zero samples for several clipping levels.

According to equation (4), the clipping signal Clip (t) has non-zero values only in the case when the original signal S(t) exceeds the CR. Thus, according to an OFDM complementary cumulative distribution function (CCDF), for most practical CR values (3 through 6 dB), the probabilities exceeding peak-to-average power ratio (PAPR) level are relatively low. Therefore, the clipping signal Clip (t) contains mostly zero samples together with a few non-zero samples (see FIG. 5). In FIG. 5, the clipping signal Clip (t) contains 84%, 90%, 95% and 97.2% of zero samples for CR values of 3, 4, 5 and 6 dB, respectively.

Thus, it is obvious that multiplications with the following additions can be omitted during implementation filtering shown in FIG. 2 (equation (1)) for all zero-value samples x(t). Despite operation reduction in this case, however, the total amount of hardware (the number of multipliers and adders) in the FIR shown in FIG. 2 cannot be reduced. It is not possible to simply remove some multipliers and adders because they might be required to process another non-zero samples at the next FIR cycle.

Patent Document 1 relates to an FIR filter where increase of the number of necessary multiplier circuits is prevented.

Patent Document 1: Japanese Patent Application Publication No. 2002-158561

Non-patent Document 1: J. G. Proakis and D. G. Manolakis, "Digital Signal Processing; Principle, Algorithms, and Applications," Prentice Hall, p. 503, 1996.

Non-patent Document 2: J. Armstrong, "New OFDM Peak-to-Average Power Reduction Scheme," Proceedings of VTC, vol. 1, pp. 756-760, May 2001.

Non-patent Document 3: H. A. Suraweera, K. R. Panta, M. Feramez and J. Armstrong, "OFDM Peak-to-Average Power Reduction Scheme with Spectral Masking," Proceedings of International Symposium on Communication Systems Networks and Digital Signal Processing (CSNDSP 2004), pp. 160-163, July 2004.

Non-patent Document 4: L. D. Kabulepa, T. Pionteck, A. Garcia and M. Glesner, "Design Space Exploration for Clipping and Filtering PAPR Reduction Techniques in OFDM Systems," Proceedings of the 8th International OFDM Workshop, pp. 108-112, 2003.

DISCLOSURE OF INVENTION

An object of the present invention is to provide a filter device with less hardware to reduce multiplication and addition operations for an input signal including zero-valued data.

A proposed filter device comprises a plurality of sequentially connected cells and a control unit. Each cell receives an input signal and multiplies the input signal by one of a plurality of weight coefficients and the last cell outputs a result of a filtering operation. The control unit determines whether the input signal is a zero-valued sample, allows the input signal to be written into one of the cells if the input signal is not the zero-valued sample, and stops the input signal to be written into any of the cells if the input signal is the zero-valued sample.

According to such a filter device, the total number of multiplication operations can be reduced to the only necessary number, i.e. the filter device can operate with only non-zero samples included in the input signals. Thus, the total number of multipliers can be reduced, thereby the hardware complexity reduction is achieved.

A proposed transmitter comprises a limiter, a filer device, an adder and an amplifier. The limiter clips amplitude of an input signal and outputs a clipping signal and a clipped signal. The filer device performs a filtering operation on the clipping signal and outputs a filtered signal. The adder adds the filtered signal and the clipped signal and outputs an addition signal. The amplifier amplifies the addition signal and outputs an amplified signal.

The filer device includes a plurality of sequentially connected cells and a control unit. Each cell receives the clipping signal and multiplies the clipping signal by one of a plurality of weight coefficients and the last cell outputs a result of the filtering operation. The control unit determines whether the clipping signal is a zero-valued sample, allows the clipping signal to be written into one of the cells if the clipping signal is not the zero-valued sample, and stops the clipping signal to be written into any of the cells if the clipping signal is the zero-valued sample.

According to such a transmitter, the hardware complexity of the filer device in the transmitter can be reduced as described above.

BEST MODE OF CARRYING OUT THE INVENTION

A best mode for carrying out the present invention is hereinafter described in detail with reference to the drawings.

Figure 6:
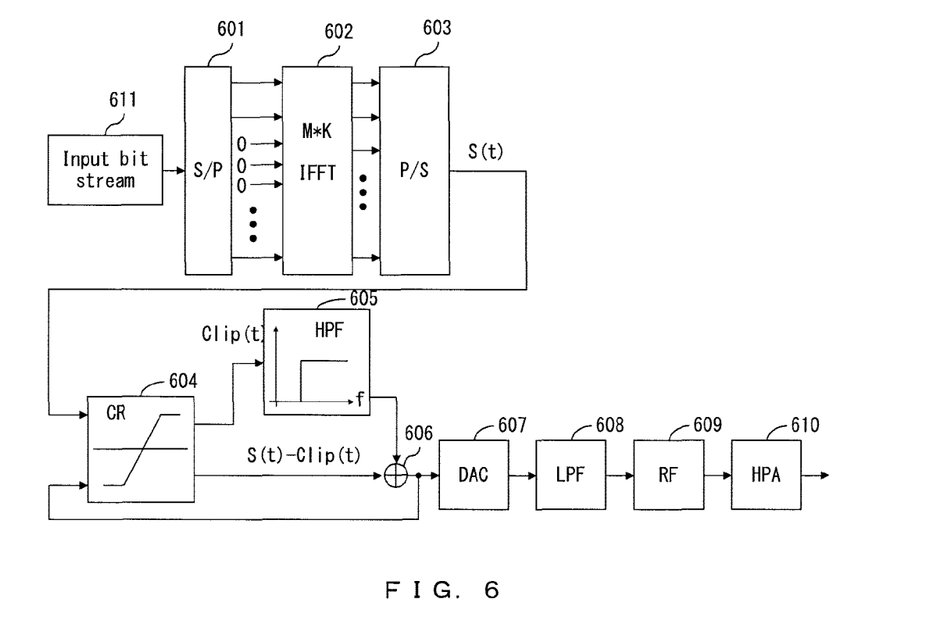
FIG. 6 is a configuration diagram showing a transmitter in an OFDM communication system according to an embodiment.

FIG. 6 shows a configuration example of a transmitter in an OFDM communication system according to an embodiment. This transmitter comprises an S/P converter 601, an IFFT processor 602 with a size of M, a P/S converter 603, a limiter 604, an HPF 605, an adder 606, a DAC 607, an LPF 608, an RF up-converter 609 and an HPA 610 operating in class A or A-B. The input bit stream 611 is input to the S/P converter

601. The operations of constituent elements 601 through 604 and 606 through 610 are similar to those of the constituent elements 101 through 103, 301, 304 and 106 through 109 shown in FIG. 3.

The HPF 605 is realized by a filter device according to an embodiment. The proposed approach provides flexibility for implementation of equation (1) and at the same time reduces requirements for hardware. The basic element of the proposed approach is a filter cell (FC).

Figure 7:
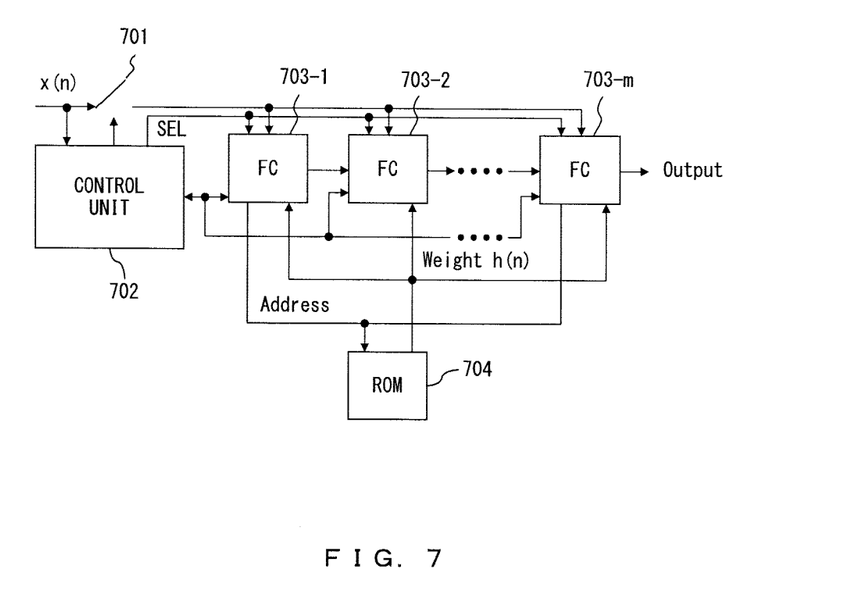
FIG. 7 is a configuration diagram showing a filter device according to an embodiment.

FIG. 7 shows a configuration example of a filter device. The filter device comprises a switch 701, a control unit 702, FCs 703-1 through 703-m with parallel data loading and a read only memory (ROM) 704. In this case, the clipping signal Clip (t) input to the filter device is represented by a signal x(n) at the n-th time.

The ROM 704 is a common ROM shared by the FCs 703-1 through 703-m and connected in parallel to the FCs. A weight function is stored in the ROM 704 in the form of a plurality of weight coefficients h(n) (n=0, 1, . . . , N−1). Each of the FCs 703-1 through 703-(m−1) outputs an address signal to the ROM 704 and reads out a weight coefficient h(n) stored at the address specified by the address signal. Thereafter, the FC performs a multiplication/addition operation with the weight coefficient h(n) and outputs an operation result. The output of each FC is connected with the input of the following FC and the last FC 703-(m−1) generates the filter output.

The control unit 702 determines whether the input data signal x(n) is a zero-valued sample and allows any non-zero sample to be written into an FC through the switch 701 and stops zero-valued samples. The non-zero sample is input to all FCs in parallel and the control unit 702 selects one of free FCs for loading that sample by using a selection signal SEL. The number of FCs preferably equals to the average number of non-zero samples in N input samples plus some margin. The margin is set to a predetermined number, for example.

Figure 8:
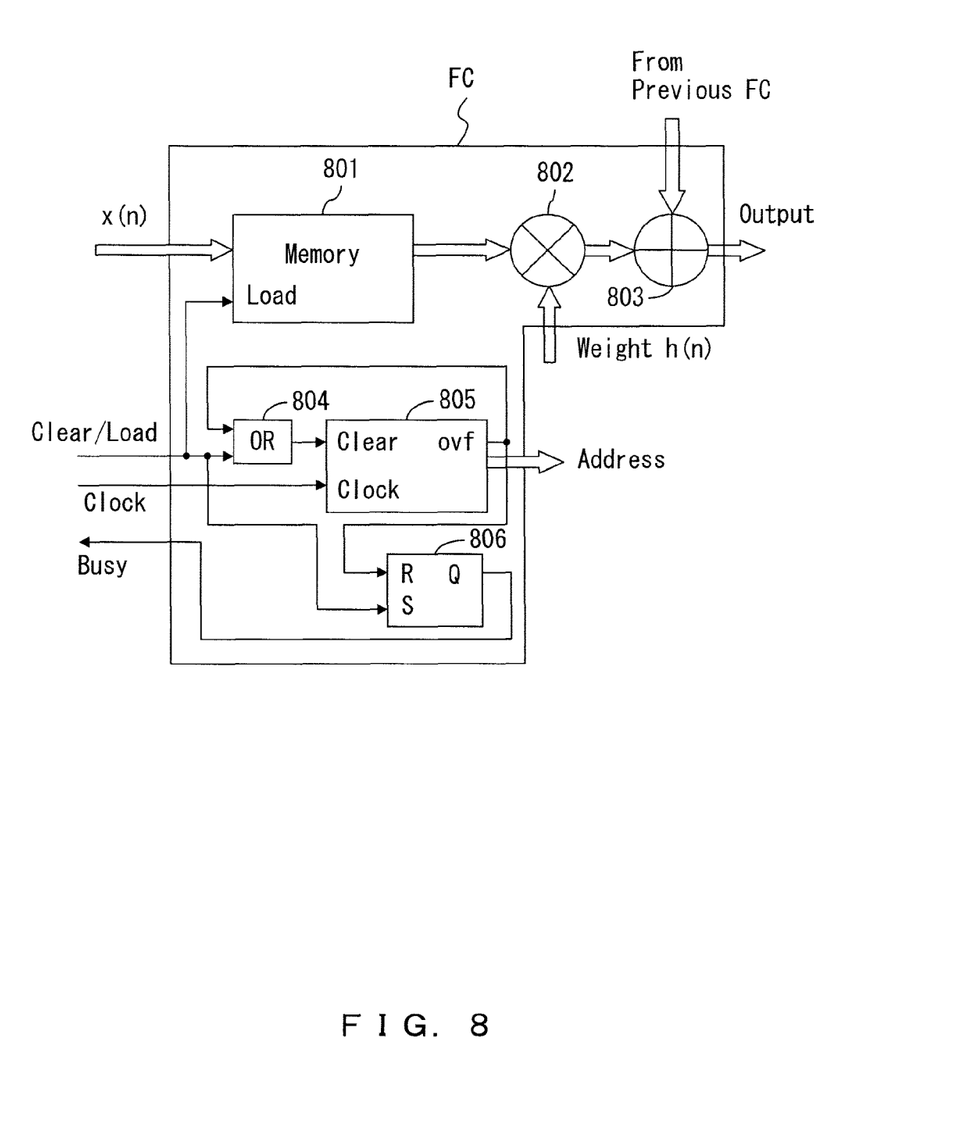
FIG. 8 is a configuration diagram showing a filter cell in the filter device.

FIG. 8 shows a configuration example of an FC shown in FIG. 7. The FC comprises a memory 801, a multiplier 802, an adder 803, an OR circuit 804, a counter 805 and a flip-flop circuit 806. The output of the counter 805 is connected to the address input of the ROM 704, the output of ROM 704 is connected to the first input of the multiplier 802, and the output of the memory 801 is connected to the second input of the multiplier 802. The memory 801 stores data of the input sample x(n) and the multiplier 802 multiplies the data by a weight coefficient h(n) output from the ROM 704. The adder 803 adds the multiplication result with the output of the previous FC and the obtained data to the following FC. The first FC 703-1 does not require the addition operation and the adder 803 is omitted from the FC 703-1.

The control unit 702 provides the FC with a clear/load signal and a clock signal and receives a busy signal from the FC. The clear/load signal is input to a load terminal of the memory 801, the OR circuit 804 and a set terminal of the flip-flop circuit 806 and the clock signal is input to a clock terminal of the counter 805. An overflow signal output from an overflow terminal of the counter 805 is input to the OR circuit 804 and a reset terminal of the flip-flop circuit 806.

The OR circuit 804 outputs a logical sum of the clear/load signal and the overflow signal to a clear terminal of the counter 805. The counter 805 performs a counting operation in accordance with the clock signal and outputs a count result as the address signal. The flip-flop circuit 806 generates the busy signal in accordance with values of the clear/load signal and the overflow signal. The busy signal indicates that the FC is in operation when it is at a high level or logic "1", whereas free at a low level or logic "0".

Figure 9:
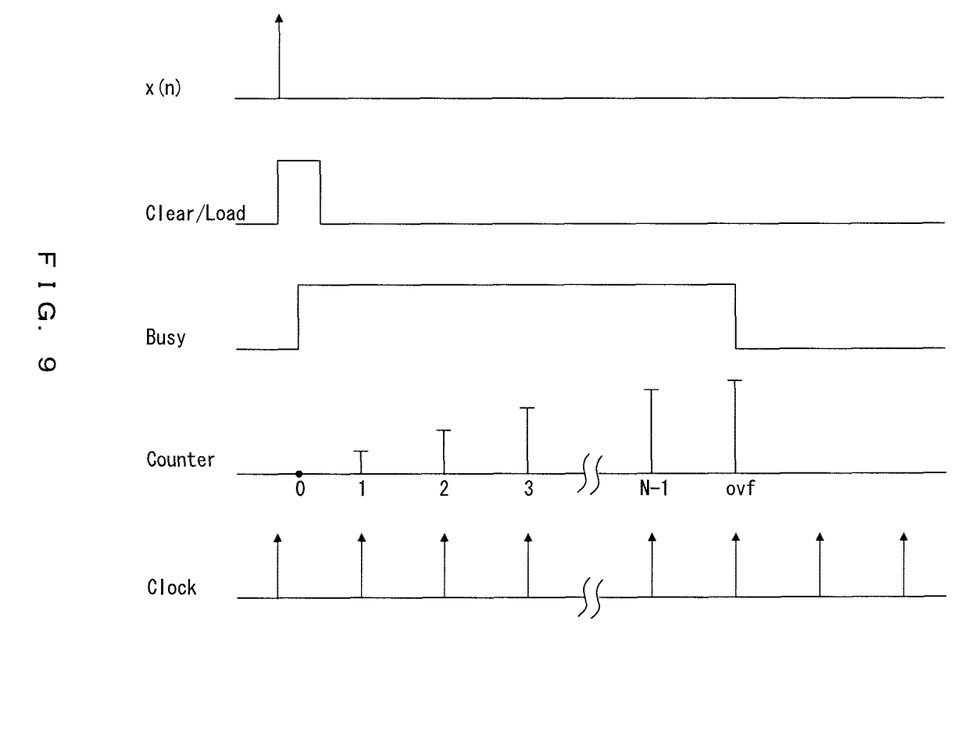
FIG. 9 is a timing chart showing an operation of the filter cell.

When loading the input sample x(n) into the memory 801 of the selected FC, the control unit 702 asserts the clear/load signal as shown in FIG. 9 and the memory 801 loads data of the input sample. At this time, the OR circuit 804 outputs a logic "1" and the output of the counter 805 is reset to zero with the overflow signal at a logic "0". The flip-flop circuit 806 outputs the busy signal at logic "1".

Next, the control unit 702 negates the clear/load signal. Therefore, the OR circuit 804 outputs a logic "0" and the output of the counter 805 is incremented every clock. Corresponding to the counter output changing from 0 to N−1, the weight coefficient input to the multiplier 802 changes from h (0) to h(N−1) with the data output from the memory 801 unchanged. Multiplying the same data by the weight coefficients h (0) through h (N−1) and adding the multiplication result to the output from the previous FC, the operation of equation (1) is realized. Since the overflow signal remains at a logic "0" during a counting operation, the flip-flop circuit 806 keeps the busy signal at logic "1".

When the counter 805 counts up and the overflow signal is asserted, the busy signal takes a logic "0" and indicates that the FC is free. The control unit 702 asserts the clear/load signal again and the contents of the memory 801 are cleared and the memory 801 becomes ready for new input data.

The conventional filter device shown in FIG. 2 has a sequential data propagation structure while the proposed filter device shown in FIG. 7 has a parallel data loading ability. The serial data propagation is the main reason why the hardware complexity of such a filter device could not be reduced.

According to the parallel data loading, however, the total number of operations (multiplication and addition) can be reduced to the only necessary number, i.e. the FC-based filter device can operate with only non-zero samples. Thus, the total number of multipliers and adders can be reduced, thereby the hardware complexity reduction is achieved. Furthermore, the FC-based filter device reduces power consumption, space and cost of implementation. The proposed filter device works effectively for not only the clipping signal Clip (t) but also other signals that contain several zero-valued samples.

The invention claimed is:

1. A filter device, comprising:
a plurality of sequentially connected cells each of which receives a clipping signal for clipping amplitude of an input signal and multiplies the clipping signal by one of a plurality of weight coefficients, wherein a last cell outputs a result of a filtering operation; and
a control unit configured to determine whether the clipping signal is a zero-valued sample, allow the clipping signal to be written into one of the plurality of cells when the clipping signal is not the zero-valued sample, and stop the clipping signal to be written into any of the plurality of cells when the clipping signal is the zero-valued sample.

2. The filter device according to claim 1, wherein
a number of the plurality of cells are set to be equal to an average number of non-zero samples included in clipping signals, a number of the clipping signals being equal to a number of the plurality of weight coefficients, plus a predetermined margin.

3. The filter device according to claim 1, wherein
a first cell multiplies a clipping signal by a weight coefficient and outputs a multiplication result to a following cell as an operation result, each of cells between the first cell and the last cell multiplies a clipping signal by a weight coefficient, adds a multiplication result to an operation result output from a previous cell, and outputs an addition result to a following cell as an operation result, and the last cell multiplies a clipping signal by a weight coefficient, adds a multiplication result to an operation result output from a previous cell, and outputs an addition result as the result of the filtering operation.

4. The filter device according to claim 1, further comprising a coefficient memory configured to store the plurality of weight coefficients and output the one of the plurality of weight coefficients to each of the plurality of cells when receiving an address signal from each of the plurality of cells.

5. The filter device according to claim 4, wherein each of the plurality of cells includes:
- a data memory configured to store data of the clipping signal;
- a counter configured to generate a plurality of addresses of the coefficient memory where the plurality of weight coefficients are stored and output the plurality of addresses sequentially to the coefficient memory; and
- a multiplier configured to receive the plurality of weight coefficients sequentially from the coefficient memory, multiply the clipping signal by the plurality of weight coefficients, and output a plurality of multiplication results sequentially.

6. The filter device according to claim 5, wherein the data memory loads the data of the clipping signal and the counter starts a counting operation to generate the plurality of addresses when receiving a control signal from the control unit.

7. The filter device according to claim 6, wherein each of the plurality of cells outputs a busy signal to the control unit during the counting operation and the control unit allows the clipping signal to be written into the one of the plurality of cells when the busy signal from the one of the plurality of cells is not asserted.

8. The filter device according to claim 7, wherein each of the plurality of cells asserts the busy signal when the counter overflows.

9. A transmitter, comprising:
- a limiter configured to clip amplitude of an input signal and output a clipping signal and a clipped signal;
- a filer device configured to perform a filtering operation on the clipping signal and output a filtered signal;
- an adder configured to add the filtered signal and the clipped signal and output an addition signal; and
- an amplifier configured to amplify the addition signal and output an amplified signal, wherein the filer device includes:
- a plurality of sequentially connected cells each of which receives the clipping signal and multiplies the clipping signal by one of a plurality of weight coefficients, wherein a last cell outputs a result of the filtering operation; and
- a control unit configured to determine whether the clipping signal is a zero-valued sample, allow the clipping signal to be written into one of the plurality of cells when the clipping signal is not the zero-valued sample, and stop the clipping signal to be written into any of the plurality of cells when the clipping signal is the zero-valued sample.

10. A filtering method, comprising:
- determining whether a clipping signal for clipping amplitude of an input signal is a zero-valued sample;
- allowing the clipping signal to be written into one of a plurality of sequentially connected cells when the clipping signal is not the zero-valued sample, wherein each of the plurality of cells receives the clipping signal and multiplies the clipping signal by one of a plurality of weight coefficients;
- stopping the clipping signal to be written into any of the plurality of cells when the clipping signal is the zero-valued sample; and
- outputting a result of a filtering operation from a last cell.

* * * * *